(12) United States Patent
Li et al.

(10) Patent No.: US 9,318,479 B2
(45) Date of Patent: Apr. 19, 2016

(54) ELECTROSTATIC DISCHARGE (ESD) SILICON CONTROLLED RECTIFIER (SCR) WITH LATERAL GATED SECTION

(71) Applicant: Apple Inc., Cupertino, CA (US)

(72) Inventors: Junjun Li, San Jose, CA (US); Xin Yi Zhang, Cupertino, CA (US); Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/684,872

(22) Filed: Apr. 13, 2015

(65) Prior Publication Data

US 2016/0056146 A1    Feb. 25, 2016

Related U.S. Application Data

(60) Provisional application No. 62/040,134, filed on Aug. 21, 2014.

(51) Int. Cl.
| | |
|---|---|
| H01L 27/02 | (2006.01) |
| H01L 27/088 | (2006.01) |
| H01L 29/06 | (2006.01) |
| H01L 29/744 | (2006.01) |
| H01L 29/10 | (2006.01) |
| H01L 27/06 | (2006.01) |
| H01L 29/74 | (2006.01) |
| H01L 21/00 | (2006.01) |

(52) U.S. Cl.
CPC ........ *H01L 27/0259* (2013.01); *H01L 27/0635* (2013.01); *H01L 27/0886* (2013.01); *H01L 29/0649* (2013.01); *H01L 29/1095* (2013.01); *H01L 29/744* (2013.01); *H01L 29/7436* (2013.01)

(58) Field of Classification Search
None
See application file for complete search history.

(56) References Cited

U.S. PATENT DOCUMENTS

| | | | | |
|---|---|---|---|---|
| 5,182,220 | A * | 1/1993 | Ker | H01L 27/0251 257/133 |
| 6,576,959 | B2 * | 6/2003 | Kunz | H01L 27/0262 257/355 |
| 6,764,892 | B2 * | 7/2004 | Kunz | H01L 29/87 257/355 |
| 7,494,854 | B2 * | 2/2009 | Ker | H01L 27/0266 257/107 |
| 7,944,657 | B2 * | 5/2011 | Mori | H01L 27/0251 361/118 |
| 8,129,788 | B1 * | 3/2012 | Walker | H01L 27/0262 257/355 |
| 8,405,943 | B2 | 3/2013 | Song et al. | |
| 8,623,731 | B2 | 1/2014 | Esmark | |
| 8,637,900 | B2 | 1/2014 | Gauthier, Jr. et al. | |

(Continued)

OTHER PUBLICATIONS

"A Novel Dual SCR Device for ESD Protection", Yu Bo et al., 2009, pp. 789-791.

(Continued)

*Primary Examiner* — Evren Seven
(74) *Attorney, Agent, or Firm* — Lawrence J. Merkel; Meyertons, Hood Kivlin, Kowert & Goetzel, P.C.

(57) ABSTRACT

In an embodiment, an ESD protection circuit may include an STI-bound SCR and a gated SCR that may be electrically in parallel with the STI-bound SCR. The gated SCR may be perpendicular to the STI-bound SCR in a plane of the semiconductor substrate. In an embodiment, the gated SCR may trigger more quickly and turn on more quickly than the STI-bound SCR. The STI-bound SCR may form the main current path for an ESD event. A low capacitive load with rapid response to ESD events may thus be formed. In an embodiment, the anode of the two SCRs may be shared.

20 Claims, 6 Drawing Sheets

(56) References Cited

U.S. PATENT DOCUMENTS

| | | | |
|---|---|---|---|
| 8,704,271 B2 | 4/2014 | Edwards et al. | |
| 8,829,565 B1* | 9/2014 | Yoo | H01L 29/87 257/109 |
| 2002/0109190 A1* | 8/2002 | Ker | H01L 29/87 257/355 |
| 2007/0262345 A1* | 11/2007 | Gauthier | H01L 27/84 257/162 |
| 2007/0287243 A1* | 12/2007 | Liu | H01L 27/0262 438/199 |
| 2010/0155775 A1* | 6/2010 | Gauthier, Jr. | H01L 27/0262 257/173 |
| 2011/0133247 A1* | 6/2011 | Sarbishaei | H01L 27/0262 257/173 |
| 2013/0320398 A1* | 12/2013 | Lai | H01L 27/0262 257/147 |
| 2014/0027815 A1* | 1/2014 | Su | H01L 27/0262 257/146 |
| 2014/0131764 A1* | 5/2014 | Chung | H01L 29/6609 257/119 |
| 2015/0187749 A1* | 7/2015 | Dai | H01L 27/0248 257/173 |

OTHER PUBLICATIONS

"High-k Metal Gate-bounded Silicon Controlled Rectifier for ESD Protection", Tzu-Heng Chang et al., 2012, pp. 1-7.

* cited by examiner

ELECTROSTATIC DISCHARGE (ESD) SILICON CONTROLLED RECTIFIER (SCR) WITH LATERAL GATED SECTION

This application claims benefit of priority to U.S. Provisional Patent Application Ser. No. 62/040,134, filed on Aug. 21, 2014. The above application is incorporated herein by reference in its entirety. To the extent that any incorporated material conflicts with the material expressly set forth herein, the expressly set forth material controls.

BACKGROUND

1. Technical Field

Embodiments described herein are related to electrostatic discharge (ESD) protection in integrated circuits.

2. Description of the Related Art

The transistors and other circuits fabricated in semiconductor substrates are continually being reduced in size as semiconductor fabrication technology advances. Such circuits are also increasingly susceptible to damage from ESD events, thus increasing the importance of the ESD protection implemented in integrated circuits. Generally, ESD events occur due to the accumulation of static charge, either on the integrated circuits themselves or on devices or other things that come into contact with the integrated circuits. Entities such as humans can also accumulate static charge and cause ESD events when coming into contact with an integrated circuit or its package.

A sudden discharge of the static charge can cause high currents and voltages that can damage the integrated circuit, and the potential for damage is higher with smaller feature sizes. There are various models for ESD events, which integrated circuit designers use to design and evaluate ESD protection circuits. For example, the charged device model (CDM) models the discharge of static electricity accumulated on the integrated circuit itself. The human body model (HBM) models the discharge of static electricity from a human body touch on the integrated circuit. Other models may be used for other types of ESD (e.g. the contact of various machines during manufacturing, etc.).

Typical ESD protection circuits for integrated circuits include diodes that are connected between integrated circuit input/output signal pin connections and power/ground connections. The diodes and other protection circuits are designed to turn on if an ESD event occurs, rapidly discharging the ESD event to avoid damage to the functional circuits (e.g. driver/receiver transistors) that are coupled to the pin connections. The ESD circuits are designed to withstand the maximum currents/voltages of various ESD events, according to a specification to which the integrated circuit is designed.

When a load-sensitive circuit (e.g. a high speed analog circuit) is integrated into a larger integrated circuit, the size of the ESD devices presents significant design challenges. The large ESD devices load the pins, reducing performance of the high speed circuit. The large ESD devices also consume significant area. Silicon-controlled rectifier (SCR) ESD circuits can present a lower capacitive load, but are generally slower to trigger and have a higher turn-on time than diodes, which can lead to higher voltage overshoot during fast ESD events.

SUMMARY

In an embodiment, an ESD protection circuit may include a shallow trench isolation (STI)-bound SCR and a gated SCR that may be electrically in parallel with the STI-bound SCR. The gated SCR may be perpendicular to the STI-bound SCR in a plane of the semiconductor substrate. In an embodiment, the gated SCR may trigger more quickly and turn on more quickly than the STI-bound SCR. The STI-bound SCR may form the main current path for an ESD event. A low capacitive load with rapid response to ESD events may thus be formed. In an embodiment, the anode of the two SCRs may be shared.

BRIEF DESCRIPTION OF THE DRAWINGS

The following detailed description makes reference to the accompanying drawings, which are now briefly described.

Figure 1:
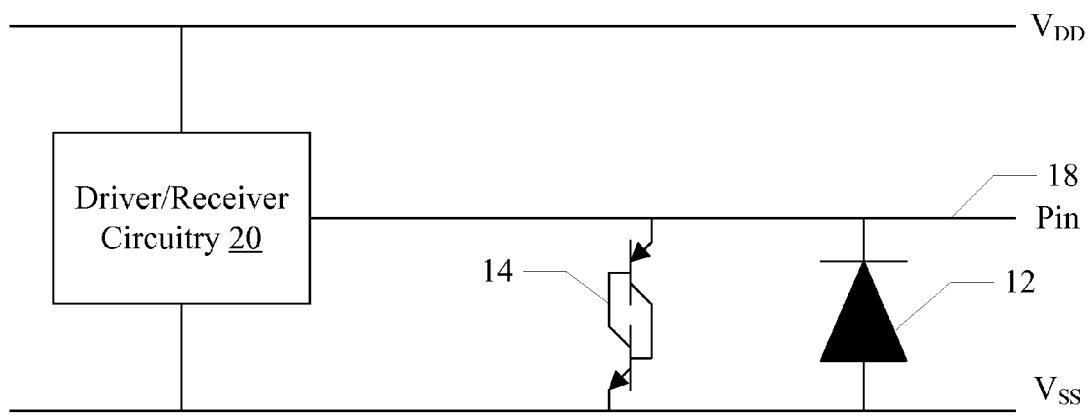
FIG. 1 is a circuit diagram of one embodiment of an electro-static discharge (ESD) protection circuit for driver/receiver circuitry.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

FIG. 1 is a circuit diagram illustrating one embodiment of an electro-static discharge (ESD) protection circuit that includes a diode 12 and a silicon-controlled rectifier (SCR) 14 to protect driver/receiver circuitry 20. The circuits 12, 14, and 20 are coupled to a conductor (wire) 18 that makes connection to a pin on a package containing the circuit of FIG. 1. A pin may generally be any external connection point (e.g. a solder ball for packages such as ball grid array, an electrical lead to connect to a through hole on a circuit board, a "leadless" lead to connect to a solder connection on a board, etc.). The pin is an external conductor, and thus may be subject to an ESD event. ESD events may include high voltages and/or currents that would otherwise damage transistors in the driver/receiver circuit 20. The circuits 12, 14, and 20 are coupled to the $V_{SS}$ (ground) rail, and the driver/receiver circuit 20 is further coupled to the $V_{DD}$ (power supply) rail. The diode 12 may be configured to conduct current to handle an ESD event from the ground ($V_{SS}$) rail to the pin (reverse-bias). The SCR 14 may be configured to conduct current to handle an ESD event to the $V_{SS}$ rail from the pin in response to a trigger (forward-bias). Accordingly, the ESD protection circuit may be bi-directional and no connection to the $V_{DD}$ rail may be needed.

In one embodiment, the SCR 14 may present a low capacitive load (as compared to a second diode, for example) and thus reduce the capacitive load on the pin. For pins that are highly sensitive to capacitance, the ESD protection circuit described herein may provide a lighter load and thus a lower impact on the functional communication on the pin. Examples of pins that are highly sensitive to capacitance may include various high speed input/output (I/O) interfaces such as Peripheral Component Interconnect Express (PCIe), universal serial bus (USB), etc. The SCR 14 may be formed using the structure illustrated in FIGS. 4-6, in one embodiment.

In some embodiments, the SCR 14 may include a shallow trench isolation (STI)-bound SCR forming the main current path for ESD current during an ESD event. The STI-bound diode may be slower to trigger and turn-on in response to the ESD event than a diode-based ESD circuit. In order to reduce the trigger/turn-on time, the SCR 14 may further include a gated SCR. Additional details will be provided below.

The driver/receiver circuitry 20 may include any circuitry to drive and/or receive signals on the pin to which the conductor 18 is connected. If the pin is an output, the circuitry 20 may include driving transistors having source or drain connections to the conductor 18. If the pin is an input, the circuitry 20 may include receiving transistors having gate connections to the conductor 18. If the pin is an input/output pin, the circuitry 20 may include both driving and receiving transistors. The driver/receiver circuitry 20 may include additional ESD protection circuitry (e.g. a voltage clamp circuit).

Figure 2:
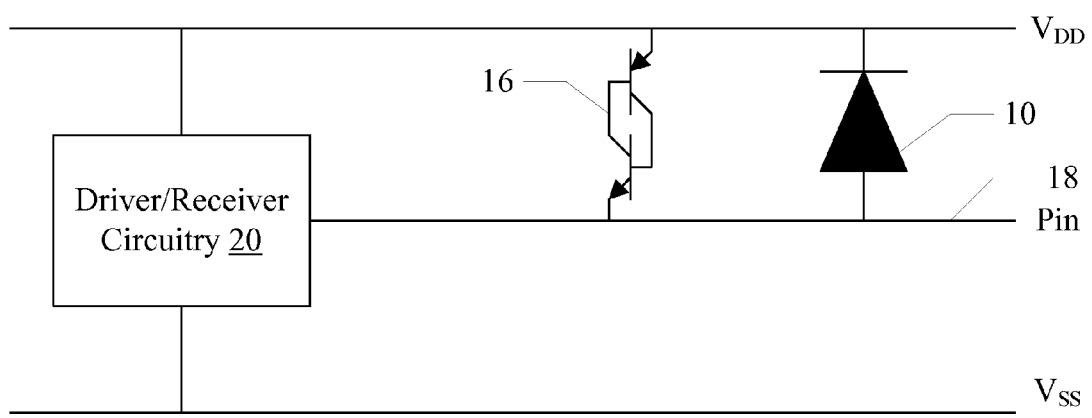
FIG. 2 is a circuit diagram of another embodiment of an ESD protection circuit for driver/receiver circuitry.

FIG. 2 is a circuit diagram illustrating another embodiment of an ESD protection circuit that includes a diode 10 and an SCR 16 to protect the driver/receiver circuitry 20. The circuits 10, 16, and 20 are coupled to the conductor (wire) 18 that makes connection to a pin on a package containing the circuit of FIG. 2. The circuits 10, 16, and 20 are coupled to the $V_{DD}$ rail, and the driver/receiver circuit 20 is further coupled to the $V_{SS}$ rail. Similar to the diode 12 and the SCR 14 in FIG. 1, the diode 10 may be configured to conduct current to handle an ESD event to the $V_{DD}$ rail from the pin and the SCR 16 may be configured to conduct current to handle an ESD event to the pin from the $V_{DD}$ rail. Accordingly, the ESD protection circuit may be bi-directional and no connection to the $V_{SS}$ rail may be needed. Similar to the discussion above, the embodiment of FIG. 2 may be a low capacitance solution for the pins that are sensitive to capacitance. Additionally, the SCR 16 may have a STI-bound portion and a gated SCR.

It is noted that the embodiment of FIG. 2 may be used in a "triple well" process in which an isolated P-well is available in the semiconductor substrate. It is further noted that, if desired, both of the ESD circuits shown in FIG. 1 and FIG. 2 may be used in some embodiments. The $V_{DD}$ and $V_{SS}$ rails may be examples of voltage rails. Generally, a voltage rail may refer to interconnect provided in an integrated circuit to be connected to a particular voltage level (e.g. $V_{DD}$ and $V_{SS}$, or power and ground, respectively). For many integrated circuits, multiple pins on a package may be coupled to the power rail and multiple pins may be coupled to a ground rail, to help stabilize the voltages in the presence of (possibly large) current flows.

Figure 3:
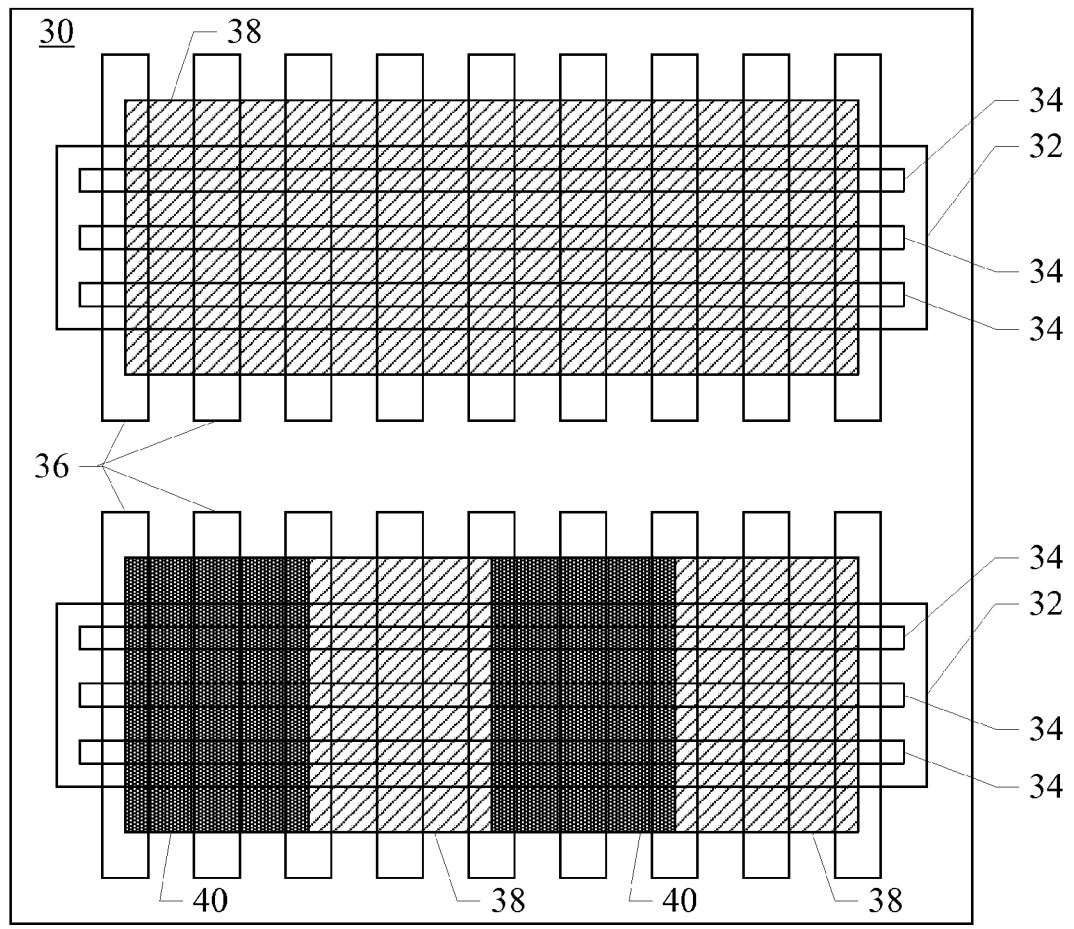
FIG. 3 is a block diagram of one embodiment of a top view of a semiconductor substrate employing a fin field effect transistor (FinFET) technology.

FIG. 3 is a top view of one embodiment of a semiconductor substrate. In the illustrated embodiment, the substrate may be P-type (P). The substrate may include an N-type (N) well 30 formed in the P-type substrate. Other embodiments may have an N-type substrate and may use a P-well, or a dual-well semiconductor fabrication process may be used. More particularly, in one embodiment, N-wells may be formed and the remainder of the substrate may be P-well (or vice versa). Semiconductor regions 32 may be formed within the N-well 30. In one embodiment, the semiconductor material is silicon. The semiconductor regions 32 may be insulated from each other using any fabrication technique (e.g. STI). The semiconductor regions 32 may include multiple "fins" 34 in a FinFET semiconductor fabrication technology. That is, the fins 34 in the semiconductor regions 32 may rise above the surface of the substrate as compared to the well 30, for example. The fins 34 in each region 32 may be parallel to each other and parallel to the fins 34 in other regions 32.

The fins 34 may be doped with impurities to produce highly doped N-type and P-type conduction regions (denoted as N+ and P+). A highly-doped region may include a greater density of the impurities than the normally doped regions/wells (e.g. P-wells, N-wells, and semiconductor substrate regions). For example, highly-doped regions may include one or more orders of magnitude greater density of impurities than the normally doped regions. In the illustrated embodiment, cross-hatched areas 38 may represent P+ regions and dot-filled areas 40 may represent N+ regions. The areas 38 and 40 may be the areas over which the dopants may be implanted. The fins 34 may actually be separated by insulators such as STI, and so the actual N+ and P+ regions may be in the fins 34 themselves. The N+ and P+ regions may be constructed in areas of the substrate in which diodes and SCRs are to be formed (e.g. to form ESD protection circuits). Depending on the FinFET fabrication process, the fins may be further grown into other shapes such as diamond or merged together through a semiconductor epitaxial process step.

Each semiconductor region 32 may have polysilicon "fingers" built thereon. For example, fingers 36 are illustrated in FIG. 3. The fingers may form gates for transistors formed in the fins 34 in areas where transistors are fabricated, for example. The P-well sections of the semiconductor substrate may similarly include semiconductor regions 32 having fins 34, fingers 36, and N+ and P+ areas 38 and 40.

The border between each P+ and N+ area forms a P-N junction (more briefly PN junction) that may operate as a diode or may be used as one of the PN junctions of an SCR. Additionally, borders between P-wells and N-wells form PN junctions that may form diodes or SCR junctions. Similarly, borders between P+ areas and N-wells, and borders between N+ areas and P-wells, may form PN junctions. There may be gated diodes/SCRs formed across a region 32 (e.g. the region 32 on the bottom of FIG. 3, in which multiple P+ and N+ areas are formed within the region). Additionally, STI-bound diodes/SCRs may be formed between regions 32, where one of the regions 32 is within the N-well 30 and the other region 32 is in a P-well (e.g. the P-well outside the N-well 30).

It is noted that, in other embodiments, adjacent regions 32 may be entirely of the opposite conduction type (e.g. the P+ area on the top region 32 may be adjacent to another region 32 that is entirely N+). Alternatively, adjacent regions may have the same conduction type. Any combination of various P+ and N+ areas in adjacent regions may be used.

Figure 4:
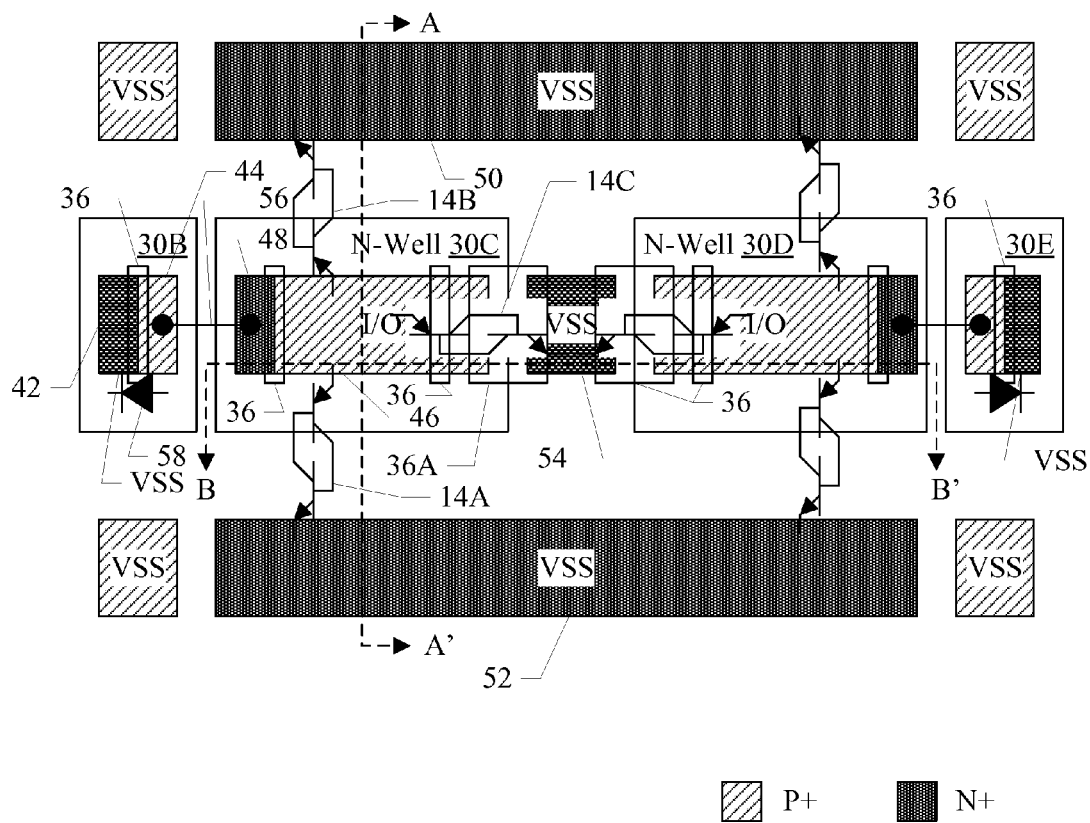
FIG. 4 is a block diagram of one embodiment of a simplified top view of ESD protection circuits of FIG. 1 on a semiconductor substrate.

FIG. 4 is a block diagram of one embodiment of a top view of ESD protection circuits of FIG. 1 on a semiconductor substrate. FIG. 4 may be a simplified view. Some regions 32 that include N+ or P+ areas, including fingers 36 and fins 34, are illustrated as blocks of conduction type (N+, P+, or mixed N+ and P+). Some of the fingers 36 in some of the regions 32 are shown as well. Each area should be viewed as a region 32 similar to that shown in FIG. 3, in an embodiment (or multiple adjacent regions 32). Various N-wells 30B-30E are shown in FIG. 4. Areas outside of the N-wells 30B-30E may be P-well in this embodiment of the FinFET technology. P-wells are not shown in FIG. 4, but are illustrated in the cross-sections of FIGS. 5 and 6.

N-wells 30C-30D each include regions that are primarily P+ and that form P-type transistors for I/O driver/receiver circuits similar to the circuits 20 shown in FIG. 1 or 2. The regions may further include an N+ portion that may be used to form the triggers of the SCRs. The embodiment of FIG. 4 may implement SCRs 14 similar to the embodiment of FIG. 1. The N-well 30C includes a region that is primarily P+ area 46, and also includes an N+ area 48. In the adjoining P-well, N+ regions 50, 52, and 54 are coupled to the $V_{SS}$ rail. The discussion below will focus on the SCRs formed between the N-Well 30C region and the $V_{SS}$ regions 50, 52, and 54. A similar discussion may apply to the N-Well 30D and the $V_{SS}$ regions 50, 52, and 54.

The SCR 14 formed between the N-well 30C and the $V_{SS}$ regions 50, 52, and 54 may include SCRs 14A, 14B, and 14C. The SCRs 14A and 14B may be STI-bound SCRs between the P+ area 46 and the N+ regions 52 and 50, respectively. The SCR 14C may be a gated SCR. The gated SCR 14C may be perpendicular to the SCRs 14A-14B in the plane of the integrated circuit.

More particularly, the P+ area 46 to the N-well 30C may form a first PN junction of the SCR and the P-well containing the N+ region 52 to the N+ region 52 itself may be another PN junction. Together, the first and second PN junctions form the PNPN junction of the SCR 14A. The P+ area 46 to the N-well 30C may form a third PN junction and the P-well containing the N+ region 50 to the N+ region 50 itself may form a fourth PN junction. Together, the third and fourth PN junctions may form the PNPN junction of the SCR 14B. The P+ area 46 to the N-well 30C may form a fifth PN junction and the P-well containing the N+ region 54 to the N+ region 54 itself may be a sixth PN junction. Together, the fifth and sixth PN junctions may form the PNPN junction of the SCR 14C. As shown in FIG. 4, the SCRs 14A-14C may share a diffusion area (P+ area 46) and a well (N-well 30C). That is, the anodes of the SCRs 14A-14C may be shared.

Fingers 36 in the N-well 30C are shown, as well as a finger 36A that is wider than other fingers bridging the N-well 30C to the N+ region 54. The finger 36A may thus cover the area between the anode and the cathode of the SCR 14C. While polysilicon fingers 36 may be used (including finger 36A), other embodiments may employ metal fingers 36 (including finger 36A) to form the gate. The SCR 14C is fabricated within a fin "island." That is, the same fins may extend through the N-wells 30C-30D and the $V_{SS}$ region 54. Accordingly, the gated SCR 14C may provide fast triggering. In an embodiment, the SCR 14C may trigger and may increase the potential in the N-well 30C, which may more quickly trigger the SCRs 14A-14B. The SCR 14C is perpendicular to the SCRs 14A-14B, as illustrated in FIG. 4, and the anodes of the SCRs 14A-14C are shared (i.e., the P+ area 46).

In the illustrated embodiment, a trigger diode 58 may be used to detect the ESD event and trigger the SCRs 14A-14C. The trigger diode 58 may be formed between the P+ area 44 and the N+ area 42. A connection 56 may be formed between the areas 44 and 48 to connect the trigger diode 58 to the trigger in the N-well 30C (i.e. the N+ region 48). In other embodiments, other trigger circuits and/or leakage control circuits may be used. For example, an R-C trigger circuit may be used, or various leakage control circuits, gate control circuits, or parasitic metal-oxide-semiconductor (MOS) trigger elements may be used.

Figure 5:
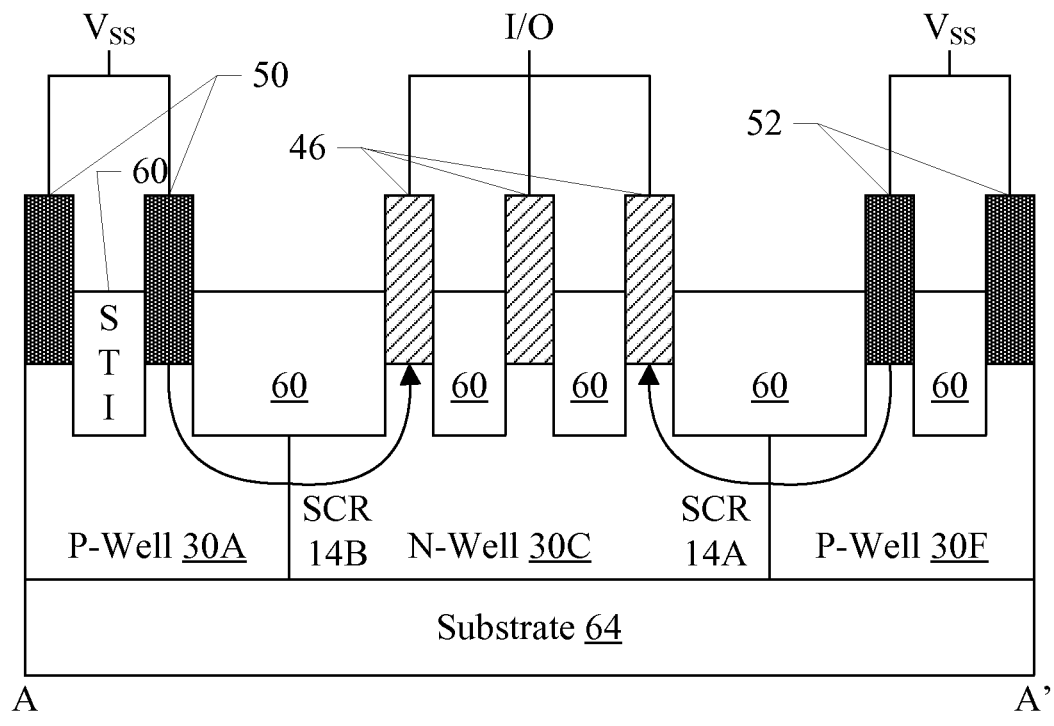
FIG. 5 is a block diagram of one embodiment of a cross section of the semiconductor substrate along a line A-A' in FIG. 4.
Figure 6:
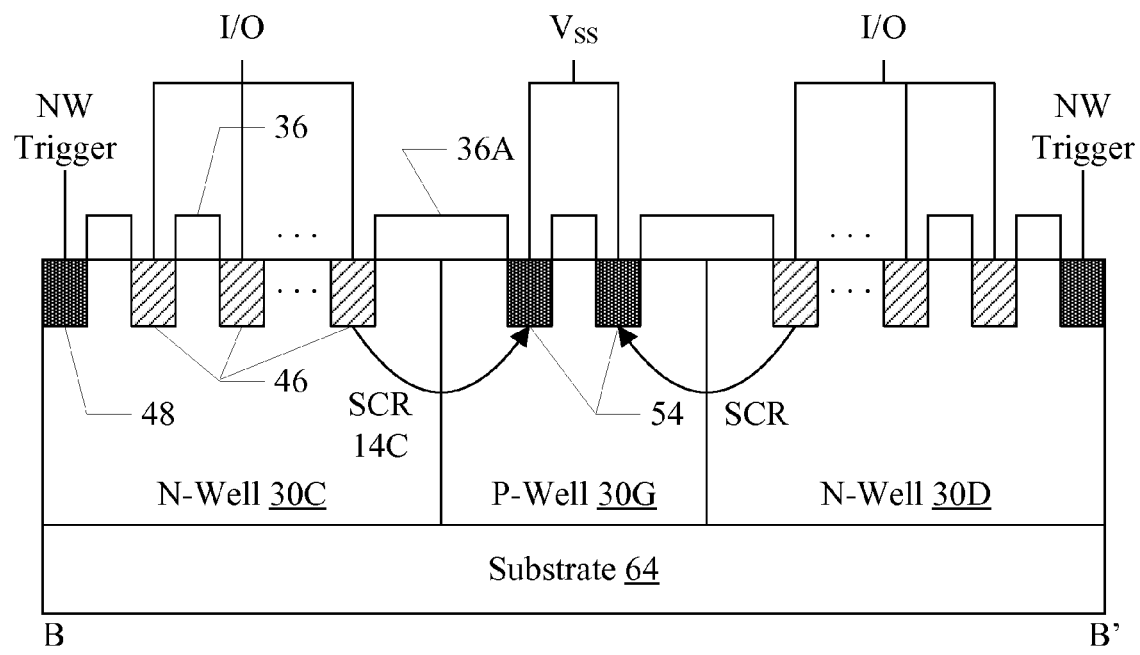
FIG. 6 is a block diagram of one embodiment of a cross section of the semiconductor substrate along a line B-B' in FIG. 4.

Lines A-A' and B-B' are illustrated in FIG. 4, and correspond to the cross sections of FIGS. 5 and 6, respectively.

FIG. 5 is a cross section taken along the line A-A' in FIG. 4. A semiconductor substrate 64 is shown, into which the N-well 30C is implanted. P-wells 30A and 30F are also illustrated in FIG. 5. P-wells 30A and 30F may be part of an overall P-well that may be provided in the substrate 64 at places that are not N-wells in the substrate 64. The N+ regions 50 and 52, and the P+ area 46 are shown with various fins in the regions/area. The fins are separated by STI structures 60 in each region/area 50, 52, and 46. Thus, the actually highly-doped areas may be the areas under and in the fins. Additionally, STI structures 60 separate the regions/area 50, 52, and 46. The STI structures 60 between regions/area may be wider than the STI structures 60 within a region/area in an embodiment. Additionally, depths of the STI structures 60 between regions/areas may differ from the STI structures 60 within a region/area. While two to three fins are shown in a given region, in part due to the available space in the drawing, various embodiments may employ any desired number of fins.

The SCR 14B is illustrated from the N+ region 50 to the P-well 30A to the N-well 30C to the P+ area 46, and similarly the SCR 14A is illustrated from the N+ region 52 to the P-well 30F to the N-well 30C to the P+ area 46. It is noted that, while the arrows illustrating the SCRs 14A-14B extend from one fin of each region to the fin of the adjoining region, each fin of the region may contribute to the SCRs 14A-14B.

FIG. 6 is a cross section taken along the line B-B' in FIG. 4. The semiconductor substrate 64 is shown, into which the N-wells 30C and 30D are implanted. P-well 30G is also shown. N-well 30C includes N+ area 48 and P+ area 46; and similar P+ and N+ areas are included in the N-Well 30D. The trigger input coupled to the N+ area 48 is illustrated, and may be coupled to the connector 56 in an embodiment or to other circuitry for triggering the SCR 14C in other embodiments. The I/O input/output is coupled to the P+ areas 46, and fingers 36 and 36A are illustrated as gate material in the figure. The SCR 14C is formed from the P+ area 46 to the N-well 30C to the P-well 30G to the N+ region 54.

Figure 7:
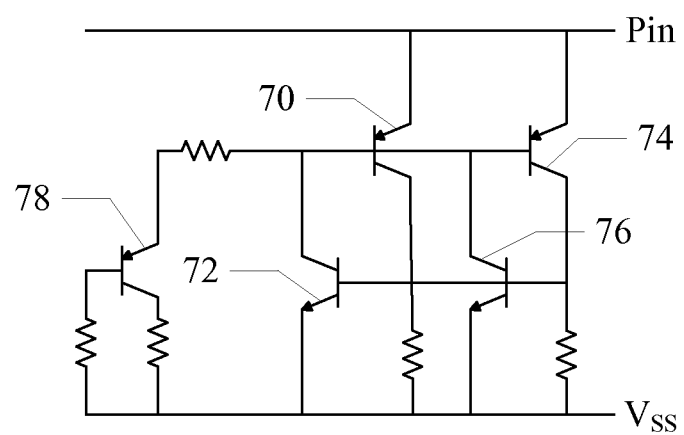
FIG. 7 is a circuit diagram illustrating one embodiment of the ESD protection circuit of FIG. 1 in greater detail.

FIG. 7 is a circuit diagram illustrating the SCRs 14A and 14C and the trigger diode for one embodiment. The SCR 14A in FIG. 7 may include the transistors 70 and 72, while the SCR 14C includes the transistors 74 and 76. Another transistor 78 may form the trigger diode 58 for the SCR 14, for embodiments that employ the trigger diode.

Numerous variations and modifications will become apparent to those skilled in the art once the above disclosure is fully appreciated. It is intended that the following claims be interpreted to embrace all such variations and modifications.

What is claimed is:

1. An electrostatic discharge (ESD) protection circuit comprising:
    a shallow trench isolation (STI)-bound silicon controlled rectifier (SCR) coupled between an input/output conductor and a voltage rail, wherein the STI-bound SCR extends between a first semiconductor region and a second semiconductor region, wherein the first semiconductor region and the second semiconductor region are separated by an STI region; and
    a gated SCR coupled between the input/output conductor and the voltage rail.

2. The ESD protection circuit as recited in claim 1 wherein the STI-bound SCR and the gated SCR are formed on a semiconductor substrate, and wherein the STI-bound SCR is formed to be perpendicular to the gated SCR in a layout view of the semiconductor substrate.

3. The ESD protection circuit as recited in claim 2 wherein the STI-bound SCR is formed between two adjacent regions of fins in the semiconductor substrate.

4. The ESD protection circuit as recited in claim 3 wherein the gated SCR is formed within one of the two adjacent regions of fins.

5. The ESD protection circuit as recited in claim 2 wherein a first node of the STI-bound SCR and a second node of the gated SCR are in a same diffusion area in the semiconductor substrate.

6. The ESD protection circuit as recited in claim 2 wherein a first node of the STI-bound SCR and a second node of the gated SCR are in a same N-well in the semiconductor substrate.

7. The ESD protection circuit as recited in claim 2 further comprising a trigger diode configured to trigger the STI-bound SCR and the gated SCR.

8. The ESD protection circuit as recited in claim 7 wherein the trigger diode is in a same region of fins as the STI-bound SCR and the gated SCR.

9. The ESD protection circuit as recited in claim 1 comprising:
    an N-type (N)-well formed in a semiconductor substrate wherein an area around the N-well is a P-well forming a first PN junction;
    a P-type highly doped (P+) area formed in the N-well, forming a second PN junction;
    a first N-type highly doped (N+) area formed in the P-well, forming a third PN junction, wherein the first PN junction, the second PN junction, and the third PN junction form the STI-bound SCR; and
    a second N+ region formed in the P-well forming a fourth PN junction, wherein the first PN junction, the second PN junction, and the fourth PN junction forming the gated SCR.

10. The ESD protection circuit as recited in claim 1 wherein the voltage rail is a ground rail.

11. A fin field effect transistor (FinFET) electrostatic discharge (ESD) protection circuit comprising:
    an N-type (N)-well formed in a semiconductor substrate wherein an area around the N-well is a P-well forming a first PN junction;
    a P-type highly doped (P+) area formed in the N-well, forming a second PN junction;
    a first N-type highly doped (N+) area formed in the P-well, forming a third PN junction, wherein the first PN junction, the second PN junction, and the third PN junction form a first silicon controlled rectifier (SCR); and
    a second N+ region formed in the P-well forming a fourth PN junction, wherein the first PN junction, the second PN junction, and the fourth PN junction forming a second SCR that is perpendicular to the first SCR.

12. The FinFET ESD protection circuit as recited in claim 11 wherein the first SCR is a shallow trench isolation (STI)-bound SCR.

13. The FinFET ESD protection circuit as recited in claim 11 wherein the second SCR is a gated SCR.

14. The FinFET ESD protection circuit as recited in claim 11 wherein the first and second N+ regions are coupled to a ground input, and wherein the first and second SCRs are electrically coupled in parallel.

15. The FinFET ESD protection circuit as recited in claim 11 further comprising a second N-well having N+ and P+ regions, wherein a diode in the second N-well is a trigger for the first SCR and the second SCR.

16. A fin field effect transistor (FinFET) electrostatic discharge (ESD) protection circuit comprising:
    a first region of fins and a second region of fins on a semiconductor substrate, wherein the first and second regions of fins are separated by an isolation structure;
    a first silicon controlled rectifier (SCR) formed between the first region of fins and the second region of fins; and
    a second SCR formed within the first region of fins and perpendicular to the first SCR, wherein the first and second SCR share a node within the first region of fins.

17. The FinFET ESD protection circuit as recited in claim 16 wherein the isolation structure comprises a shallow trench isolation (STI) structure.

18. The FinFET ESD protection circuit as recited in claim 16 wherein the first SCR is a shallow trench isolation (STI)-bound SCR.

19. The FinFET ESD protection circuit as recited in claim 18 wherein the second SCR is a gated SCR.

20. The FinFET ESD protection circuit as recited in claim 16 wherein the second SCR is covered by a gate material.

* * * * *